United States Patent
Zaitsu et al.

(10) Patent No.: US 8,082,651 B2
(45) Date of Patent: Dec. 27, 2011

(54) MICRO-STRUCTURE FABRICATION METHOD

(75) Inventors: Yoshitaka Zaitsu, Kawasaki (JP); Chienliu Chang, Kawasaki (JP); Masao Majima, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 649 days.

(21) Appl. No.: 12/173,158

(22) Filed: Jul. 15, 2008

(65) Prior Publication Data

US 2009/0031548 A1 Feb. 5, 2009

(30) Foreign Application Priority Data

Aug. 3, 2007 (JP) ................................. 2007-203245

(51) Int. Cl.
 *B21D 39/00* (2006.01)
 *B23P 11/00* (2006.01)
(52) U.S. Cl. .......... 29/513; 29/469; 29/602.1; 310/75 A; 310/309; 359/291
(58) Field of Classification Search ............ 29/445–447, 29/469.5, 513, 896.9; 310/75 A, 309; 359/225, 359/291
 See application file for complete search history.

(56) References Cited

U.S. PATENT DOCUMENTS

| | | | | |
|---|---|---|---|---|
| 4,770,018 A | * | 9/1988 | Bosl et al. | 72/177 |
| 5,354,533 A | * | 10/1994 | Antoine | 264/296 |
| 7,085,122 B2 | | 8/2006 | Wu et al. | 361/277 |
| 7,089,666 B2 | | 8/2006 | Kim et al. | 29/896.9 |
| 2004/0245871 A1 | | 12/2004 | Kim et al. | 310/75 A |

FOREIGN PATENT DOCUMENTS

| | | |
|---|---|---|
| JP | 2004-219839 | 8/2004 |
| JP | 2005-224933 | 8/2005 |
| JP | 2006-296138 | 10/2006 |

* cited by examiner

*Primary Examiner* — Paul D Kim
(74) *Attorney, Agent, or Firm* — Fitzpatrick, Cella, Harper & Scinto

(57) ABSTRACT

A micro-structure fabrication method fabricates a micro-structure including an inclined part inclined to a principal plane of a substrate by plastically deforming a work piece having the substrate with the principal plane. The structure fabrication method includes the steps of providing in the work piece a projection configured to protrude from a first surface and away from the principal plane of the substrate, and bending the work piece toward a second surface opposite to the first surface. The bending is accomplished by applying a force on a block including an inclined pressure plane that is abutted on the projection for plastically deforming the work piece, in which in bending the work piece, the direction of a first force applied on the work piece intersects with the direction of a second force of the inclined pressure plane pushing the projection.

13 Claims, 18 Drawing Sheets

FIG. 8A1
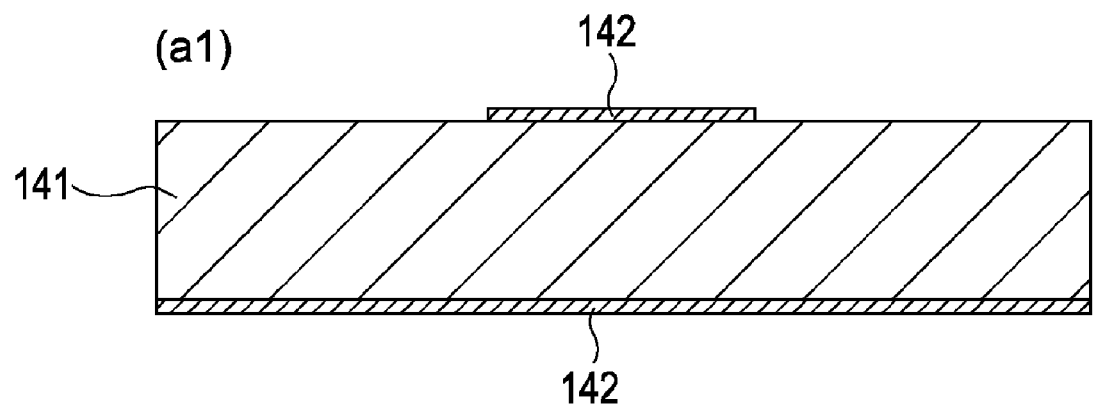
FIG. 8B1
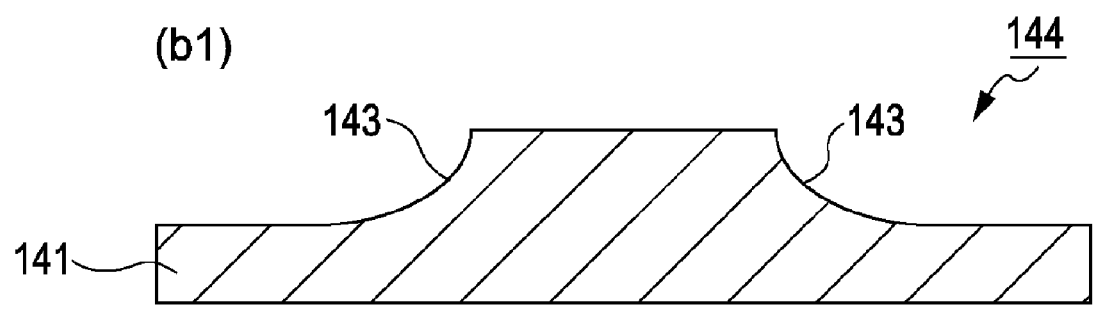

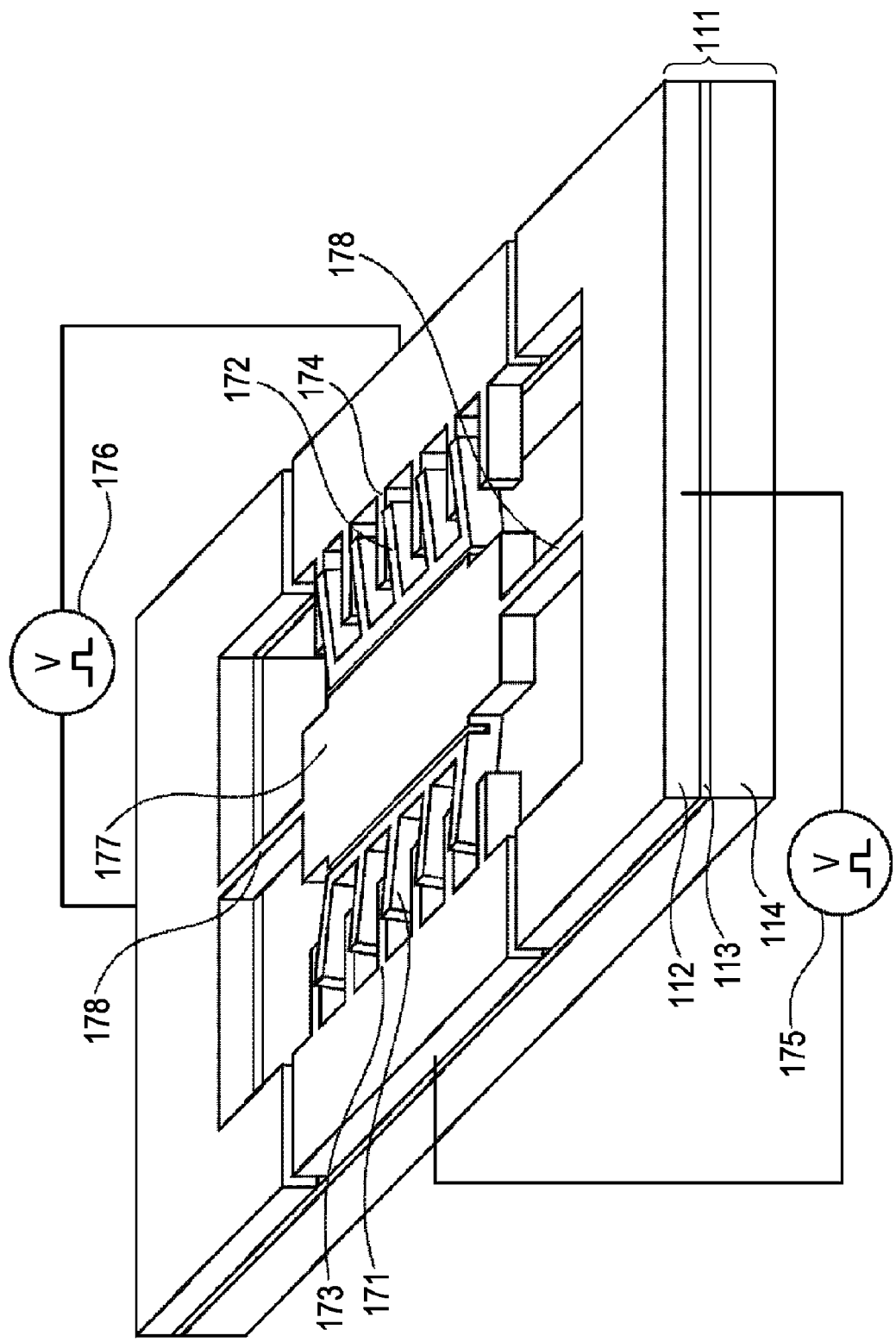

FIG. 10A2
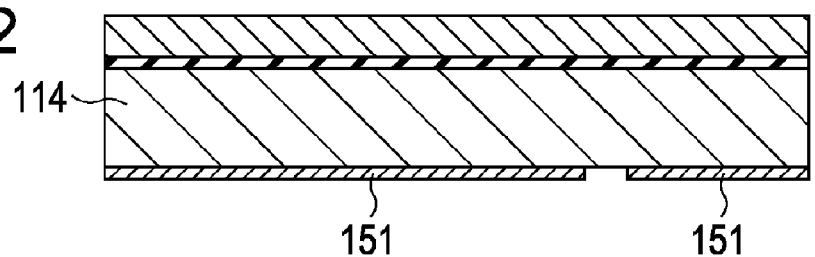
FIG. 10B2
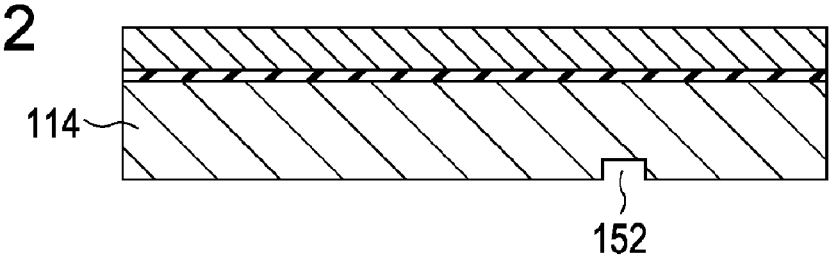
FIG. 10C2
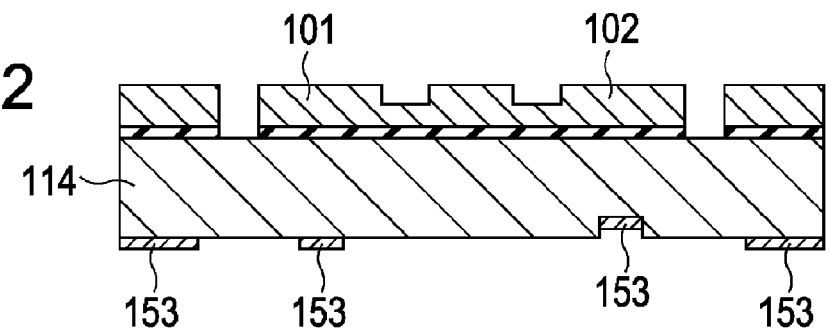
FIG. 10D2
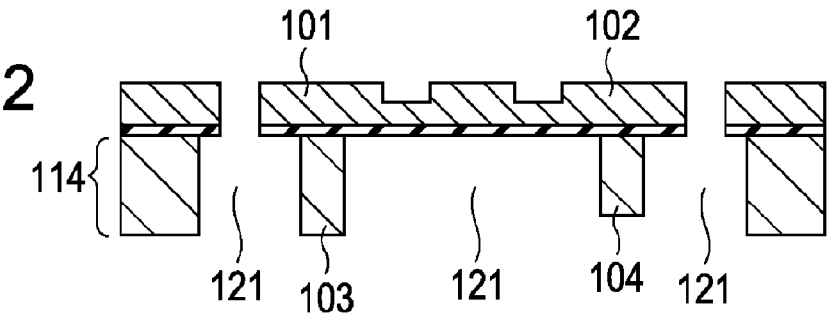

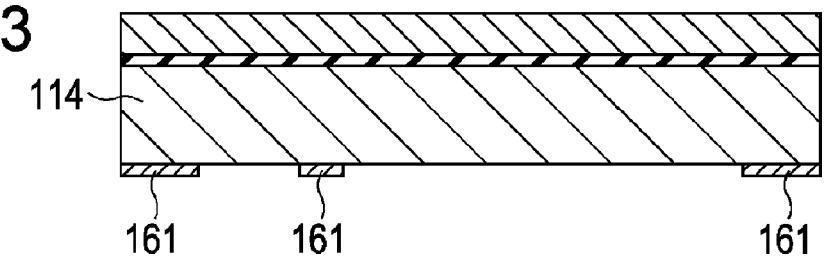
FIG. 11A3
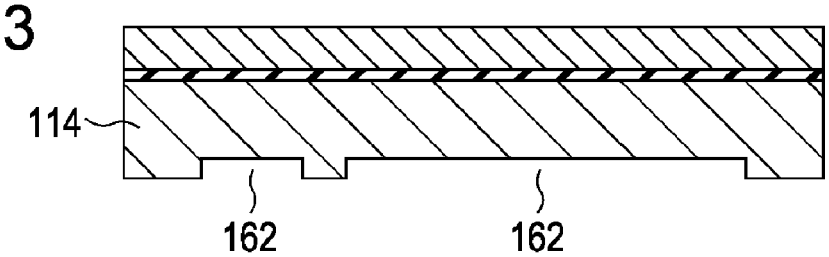
FIG. 11B3
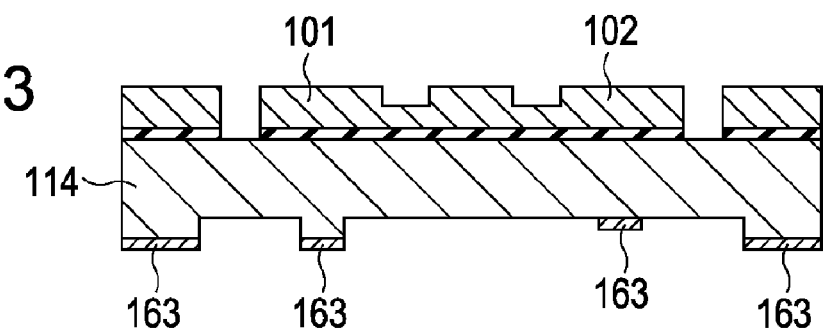
FIG. 11C3
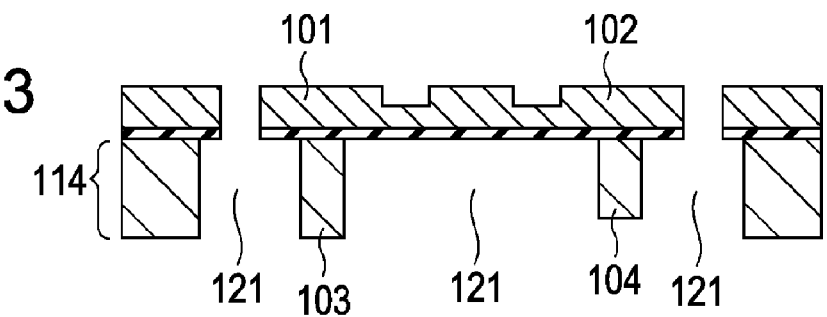
FIG. 11D3

MICRO-STRUCTURE FABRICATION METHOD

BACKGROUND OF THE INVENTION

1. Field of the Invention

The present invention relates to a structure fabrication method for fabricating a structure including a beam structure typified by a comb-structure for use in sensors and actuators to be fabricated by an MEMS technique. "MEMS" is an abbreviation for "micro electro mechanical systems".

2. Description of the Related Art

In a vertical comb-structure, also called a VC, a pair of comb fingers are arranged to mate with each other, and any one of the comb fingers is supported by an elastic body so as to be out-of-plane deformable.

For fabricating such a structure, using a micro-fabrication technique applied in a semiconductor fabrication method and called the MEMS technique, a micro-structure with a width of one comb-finger of about 5 µm can be fabricated, for example.

Applications of the vertical comb-structure fabricated by the MEMS technique include micromirrors for optical path changing and variable capacitors for radio communication, for example.

A specific example includes the electrodes of electrostatic comb-drive actuators for driving a micro oscillatory structure by an electrostatic force.

In the electrostatic comb-drive actuator using the vertical comb-structure, for displacing the comb-structure from the initial position, the generation of a large drive force is required. For increasing the drive force of a vertical comb-structure, an angular vertical comb structure and its fabrication method have been known (see U.S. Pat. No. 7,089,666). The angular vertical comb structure is also called an AVC.

The AVC and the summary of its fabrication method described in U.S. Pat. No. 7,089,666 are shown in FIGS. 16A to 16C.

The configuration of the AVC described in U.S. Pat. No. 7,089,666 is shown in FIG. 16A.

An AVC 330 includes an oscillating plate 333 journaled on a torsion spring 332 so as to rotate and oscillate about the torsion spring 332 clockwise or counterclockwise and a vertical comb structure 331 arranged on one side of the oscillating plate 333.

The torsion spring 332 is made of a material plastically deformable by being heated, such as silicon and germanium.

A method for inclining the vertical comb structure 331 is shown in FIGS. 16B and 16C.

As shown in FIG. 16B, a pressure back block 335 with a pillar 334 is pushed in straight arrow 338 direction so that the pillar 334 abuts the top surface 337 of the oscillating plate 333 on the opposite side of the vertical comb structure 331, and the oscillating plate 333 is heated.

Thereby, the oscillating plate 333 is rotated in curved arrow 339 direction and the torsion spring 332 plastically deforms in a shape that holds the rotational angle of the oscillating plate 333.

When the vertical comb structure is cooled and the block 335 is removed thereafter, as shown in FIG. 16C, the oscillating plate 333 remains inclined and the vertical comb structure 331 formed on the side of the oscillating plate 333 also maintains the state inclined together with the oscillating plate 333.

For deforming a work piece, it is necessary to apply an external force for applying a moment to generate the rotation of the work piece by some method.

In the fabrication method of the AVC described in U.S. Pat. No. 7,089,666, as shown in FIG. 17, by pushing down the block 335, an external force F is applied to the oscillating plate 333, which is a work piece, and the torsion spring 332 via the pillar 334.

As a result, the component force $F_q$ perpendicular to the oscillating plate 333 of the external force F deforms the oscillating plate 333 and the torsion spring 332 in the rotational direction about the torsion spring 332.

As the deforming angle θ in the rotational direction of the torsion spring 332 is increased, the component force $F_q$ deforming the oscillating plate 333 and the torsion spring 332 in the rotational direction decreases, while the component force $F_p$ that is not contributing to the deformation in the rotational direction increases.

Namely, when the deforming angle θ in the rotational direction of the torsion spring 332 is increased, it is understood that the transmission efficiency of the force decreases during deforming of the oscillating plate 333, which is a work piece, and the torsion spring 332.

Depending on the material, size, and structure of a work piece, the work piece may fall short of the mechanical strength. When such a work piece with insufficient mechanical strength is deformed, unless the force is efficiently transmitted to the work piece, the work piece may buckle or damage during the deforming.

SUMMARY OF THE INVENTION

The present invention provides a structure fabrication method for fabricating a structure capable of efficiently deforming a work piece plastically in a desired shape by plastically deforming part of the structure during the fabrication of the structure including an inclined part inclined to the principal plane of a substrate.

The present invention provides the following fabrication method as a fabrication method of a structure including a structure part inclined in an out-of-plane state (intersecting with a plane parallel to the principal plane of a substrate to have a predetermined angle).

In a structure fabrication method for fabricating a structure including an inclined part inclined to the principal plane of the substrate by plastically deforming a work piece of a substrate, the structure fabrication method includes the steps of providing in the work piece a projection configured to protrude toward the principal plane of the substrate; and bending the work piece toward the surface opposite to that where the projection is provided by applying a force on a block including an inclined pressure plane that is abutted on the projection for plastically deforming the work piece, in which in the bending the work piece, the direction of the force (FF) applied on the work piece intersects with the direction of the force (F1) of the inclined pressure plane pushing the projection.

According to the present invention, in an external force applied to a work piece, in comparison with related art, while a component force of the external force that is not contributing to the deformation of the work piece decreases, a component force that is contributing to the deformation of the work piece increases, so that the efficiency of deforming the work piece can be improved.

Also, at a desired position of the work piece, the plastic deformation can be facilitated as well as at positions other than that, and the possibility of deformation, buckling, and failure of the work piece can be reduced.

Further features of the present invention will become apparent from the following description of exemplary embodiments with reference to the attached drawings.

BRIEF DESCRIPTION OF THE DRAWINGS

FIGS. 8A1 and 8B1 are partial process drawings of another structure fabricating method according to the first embodiment of the present invention.

FIG. 9 is a drawing showing an example of a structure fabricated by the structure fabricating method according to the first embodiment of the present invention.

FIGS. 10A2 to 10D2 are partial process drawings of a structure fabricating method according to a second embodiment of the present invention.

FIGS. 11A3 to 11D3 are partial process drawings of another structure fabricating method according to the second embodiment of the present invention.

DESCRIPTION OF THE EMBODIMENTS

A structure fabricating method according to the present invention will be schematically described below by exemplifying a structure including a work piece inclined in an out-of-plane state with reference to FIGS. 1A and 1B.

The "out-of-plane inclination" is defined as the state of the work piece inclined by deforming (typically bending) it to have a predetermined angle, selected from the range from more than 0° to 90°, to the principal plane of a substrate. In such a manner, a structure including an inclination part inclined to the principal plane of the substrate is fabricated.

According to the present invention, "the principal plane" (also referred to the top (bottom) plane or the upper (lower) plane) of the substrate is defined as the plane with the maximum area in planes constituting the substrate so that this plane is mainly worked upon when the structure is formed. According to the present invention, a plane geometrically equivalent to and parallel with the principal plane of the substrate also belongs to the category of the principal plane of the substrate.

The fabrication method according to the present invention of a structure including an inclination part inclined to the principal plane of the substrate at a predetermined angle mainly includes the following two processes (a) and (b).

In the process of plastically deforming a work piece according to the present invention, "the pressure plane" of a block is defined as a contact surface being in touch with a projection of a structure. When the block has a curved surface, "the pressure plane" is defined as a tangent plane of the block at the part being in touch with the projection. The "tangent plane" means a planar surface at one point on a smoothly curved surface in a three-dimensional space, which shares the curved surface and the point as well as has the same inclination (the total differential value) as that (the total differential value) of the curved surface at that point.

Figure 1A:
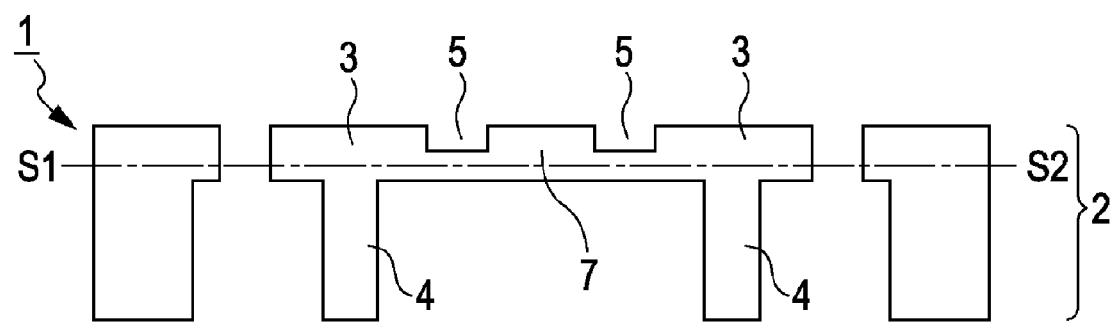
FIGS. 1A and 1B are schematic process drawings of a first example of a structure fabricating method according to the present invention.
Figure 1B:
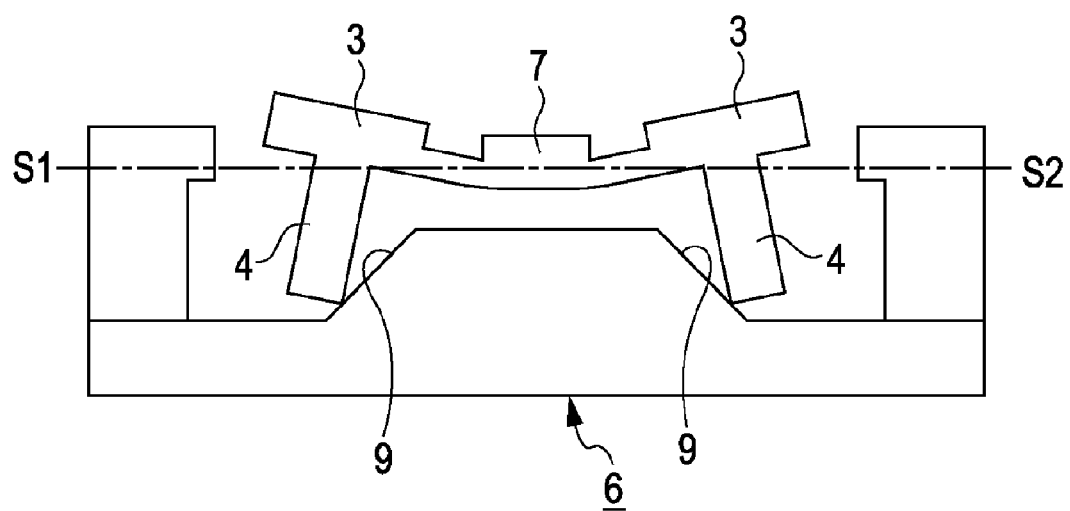

FIGS. 1A and 1B correspond to the processes (a) and (b), respectively.

(a): By fabricating a substrate 2, such as a monocrystal silicon wafer, a structure 1 is formed.

In the process (a), in order to form a structural part 3, referred to as a work piece below, to be inclined in an out-of-plane state to the principal plane (indicated by chain line S1-S2 in FIGS. 1A and 1B) of the substrate 2, projections 4 are provided to protrude in a direction intersecting with that of the principal plane of the substrate 2.

The principal plane of the substrate 2 means herein a plane to be mainly fabricated among planes of the substrate 2 and indicates the top and bottom surfaces of the substrate 2.

For facilitating the work piece 3 to be plastically deformed, a position to be the base point of the plastic deformation may also be specifically fabricated. For example, the fabrication may be made so that the mechanical strength of the point becomes smaller than that of the surrounding portion by providing depressions 5 in the point.

(b): By pressing an inclined pressure plane 9 of a block 6 on the projections 4 of the work piece 3, the work piece 3 is bent toward the surface opposite to that where the projections 4 are provided for being plastically deformed. In other words, the block 6 may also be called a jig for bending a work piece.

In the process (b), the surface shape of the pressure plane 9 to be in contact with the projections of the work piece may be planar inclined planes as shown in FIG. 1B or may be other shape such as curved inclined surfaces as shown in below-mentioned FIG. 2B.

For facilitating the work piece 3 to be plastically deformed, part or all of the work piece 3 may also be heated.

The heating timing may be before deforming the work piece 3 or may be during the deforming of the work piece 3.

In the structure fabricating method using the block 6 including the inclined pressure plane 9, the inclination part for deforming the work piece can be formed more efficiently than in a fabricating method using a block including the pressure plane parallel to the principal plane of the substrate. The reasons will be described in detail as follows.

Figure 14:
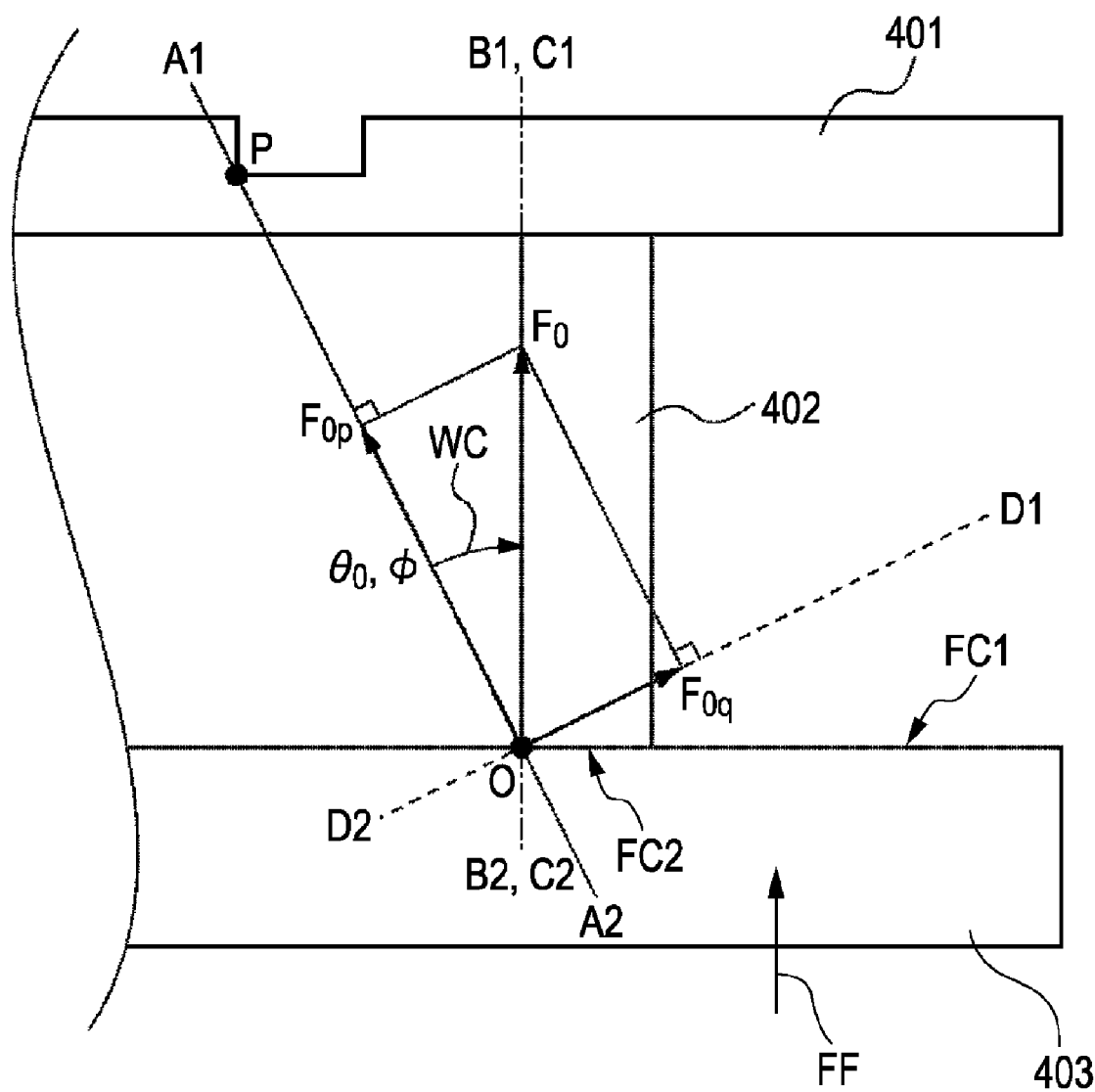
FIG. 14 is a schematic drawing showing the state of component forces of an external force applied to a work piece when a flat block is used.

The situation directly before the deforming the work piece using a block including the pressure plane parallel to the principal plane of the substrate is shown in FIG. 14.

A block 403 is pushed upward in FIG. 14 by applying a force FF to the block 403, so that an external force $F_O$ is applied at one point O at the end of a projection 402 of the work piece.

The external force $F_o$ can be decomposed into component forces in two directions as follows.

One component force is a force pushing the folding point P of the work piece 401 in a translatory direction, i.e., a component force $F_{op}$ in the direction of straight line A1-A2 passing through the point O and the point P.

The other component force is a force pushing the work piece 401 in the rotational direction about the point P, i.e., a component force $F_{oq}$ in the direction of straight line D1-D2 perpendicular to the straight line A1-A2.

The respective component forces $F_{op}$ and $F_{oq}$ are expressed as the following Expressions (1) and (2), respectively.

$$F_{op} = F_O \cos\theta_O = F_O \cos\phi \qquad (1)$$

$$F_{oq} = F_O \sin\theta_O = F_O \sin\phi \qquad (2)$$

Where the angle defined by the perpendicular B1-B2 of the tangent plane of the block 403 and the straight line A1-A2 at the point O is $\theta_O$; the angle defined by the perpendicular C1-C2 of the work piece 401 before fabrication and the straight line A1-A2 at the point O is $\phi$.

The range of values taken by the angle $\theta_O$ and the angle $\phi$ is from $-\pi/2$ to $+\pi/2$, where the clockwise direction in the drawing (curved arrow WC direction) is the normal direction.

Referring to FIG. 14, the pressure plane FC1 of the block 403 and the bottom face FC2 of the projection 402 of the work piece are both planar and parallel to each other, so that the straight line B1-B2 agrees with the straight line C1-C2 and the angle $\theta_O$ is the same as the angle $\phi$.

From Expressions (1) and (2), it is understood that with decreasing the angle $\phi$, i.e., as the position of the projection 402 of the work piece is closer to the point P, the force $F_{op}$ pushing the work piece 401 in the translatory direction increases while the force $F_{oq}$ pushing the work piece 401 in the rotational direction conversely decreases.

Figure 15:
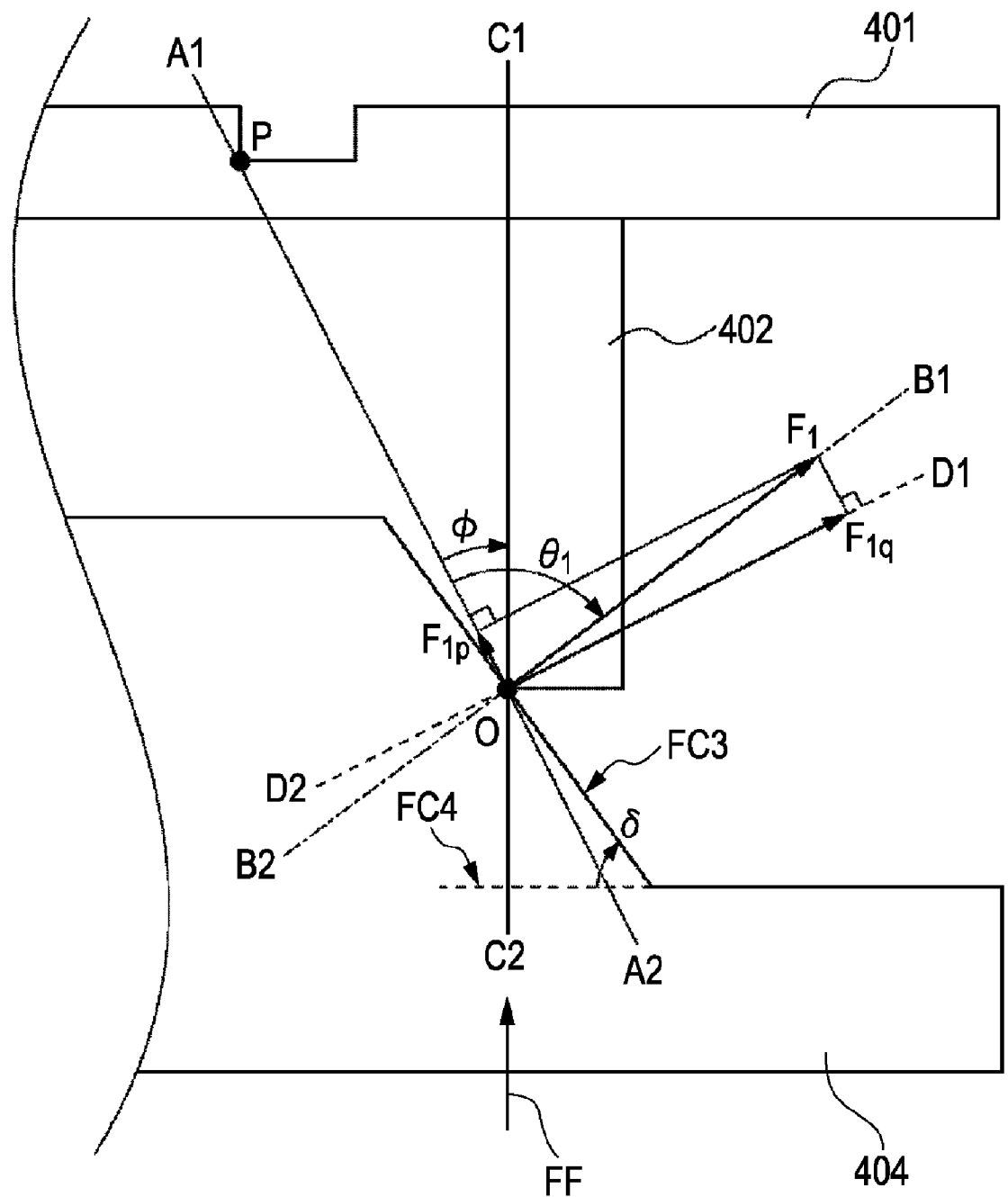
FIG. 15 is a schematic drawing showing the state of component forces of an external force applied to a work piece when a block with an inclined plane is used.
Figure 16A:
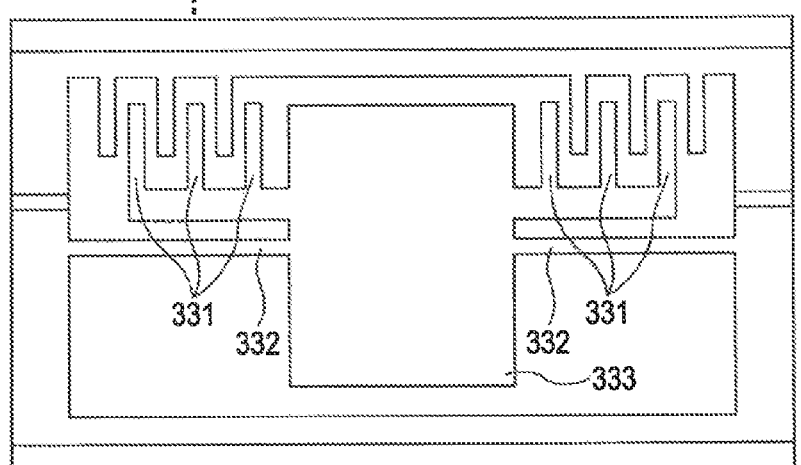
FIGS. 16A to 16C are schematic drawings showing the AVC described in U.S. Pat. No. 7,089,666 and its fabricating method.
Figure 16B:
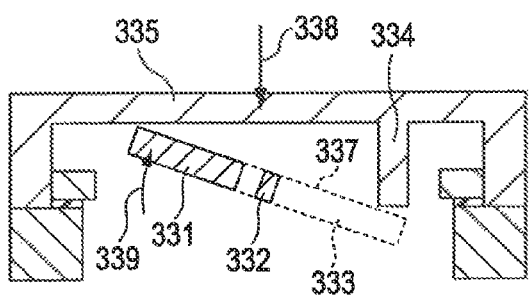
Figure 16C:
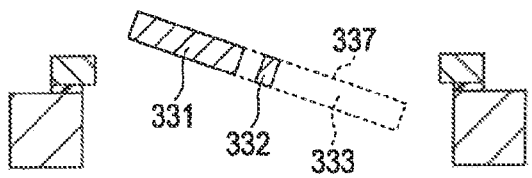
Figure 17:
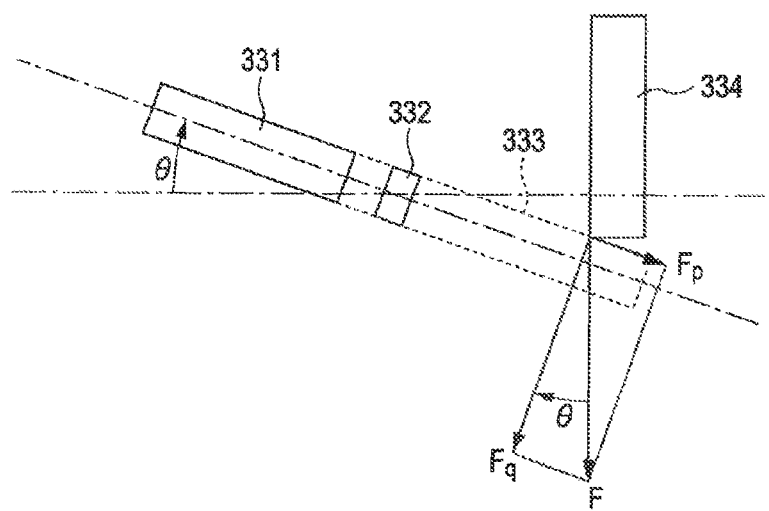
FIG. 17 is a schematic drawing showing the state of component forces of an external force applied to a work piece in the AVC described in U.S. Pat. No. 7,089,666.

Then, the situation directly before the deforming of the work piece 401 using a block including an inclined plane FC3 is shown in FIG. 15.

A block 404 is pushed upward in FIG. 15 by applying a force FF to the block 404, so that an external force F1 is applied at one point O at the end of the projection 402 of the work piece.

The external force F1, in the same way as above, can be decomposed into a component force $F_{1p}$ pushing the folding point P of the work piece 401 in a translatory direction and a component force $F_{1q}$ rotating the work piece 401 counterclockwise about the point P.

The respective component forces $F_{1p}$ and $F_{1q}$ are expressed as the following Expressions (3) and (4), respectively.

$$F_{1p} = F_1 \cos\theta_1 = F_1 \cos(\phi+\delta) \qquad (3)$$

$$F_{1q} = F_1 \sin\theta_1 = F_1 \sin(\phi+\delta) \qquad (4)$$

Where the angle defined by the perpendicular B1-B2 to the tangent plane FC3 of the block 404 and the straight line A1-A2 at the point O is $\theta_1$; the angle defined by the perpendicular C1-C2 to the work piece 401 before fabrication and the straight line A1-A2 at the point O is $\phi$.

The angle defined by the tangent plane of the block 404 and a reference plane FC4 at the point O is $\delta$, and $\delta=\theta_1-\phi$ is satisfied.

The efficiency inclining the work piece 401 will be compared between the two cases described above.

The efficiency inclining the work piece 401 is defined as follows.

The efficiency inclining the work piece 401 is defined as the value of the force rotating the work piece 401 counterclockwise divided by the force pushing the work piece 401 in the translatory direction.

The reason is that by increasing the component force rotating the work piece 401 clockwise or counterclockwise while by decreasing the other component forces, the efficiency deforming the work piece 401 is improved.

This efficiency is also correlated with the transmission efficiency transmitting the external force F1 to the component force $F_{1q}$ for deforming.

The efficiency $\eta_o$ when using the block 403 including the planar pressure plane FC1 is expressed by the following Expression (5).

$$\eta_0 = \frac{F_{0q}}{F_{0p}} = \frac{F_0 \sin\phi}{F_0 \cos\phi} = \tan\phi \qquad (5)$$

The efficiency $\eta 1$ when using the block 404 including the inclined plane FC3 is expressed by the following Expression (6).

$$\eta_1 = \frac{F_{1q}}{F_{1p}} = \frac{F_1 \sin\theta_1}{F_1 \cos\theta_1} = \tan\theta_1 \qquad (6)$$

From Expressions (5) and (6), it is understood that if $\phi<\theta_1$, $\eta_o<\eta 1$.

Furthermore, since $\theta_1=\phi+\delta$, it is understood that if $\delta>0$, $\eta_o<\eta 1$.

The condition "$\delta>0$" expresses that the plane FC3 of the block 404 is inclined to the reference plane FC4 oppositely to the direction deforming the work piece 401. In other words, the pressure plane FC3 shown in FIG. 15 is rotated at the angle $\delta$ ($>0$) clockwise in the drawing and the moment applied to the work piece 401 is rotated about the point P counterclockwise, so that the rotational directions are opposite to each other.

In such a manner, in the process folding the work piece 401, the direction of the force (FF) applied to the block 404 intersects with that of the force (F1) pushing the projection 402 by the inclined pressure plane FC3 at the angle ($\delta=\theta_1-\phi>0$).

As described above, by using the block 404 including the inclined pressure plane FC3, the efficiency deforming the work piece 401 to incline it can be improved in comparison with the case using the block 403 including the planar pressure plane FC1.

In this process, as shown in FIGS. 3A, 3B, 4A, and 4B, by changing the position where the projection 4 of the work piece is in contact with the block 6, the inclined angle of the work piece, i.e., the inclination part, can be changed. The position where the projection is in contact with the block means the position with which the projection 4 comes in contact at first when the projection 4 is approximated to the block 6, and this position is displaced by pushing the block 6 to the projection 4 after the contact.

Figure 3A:
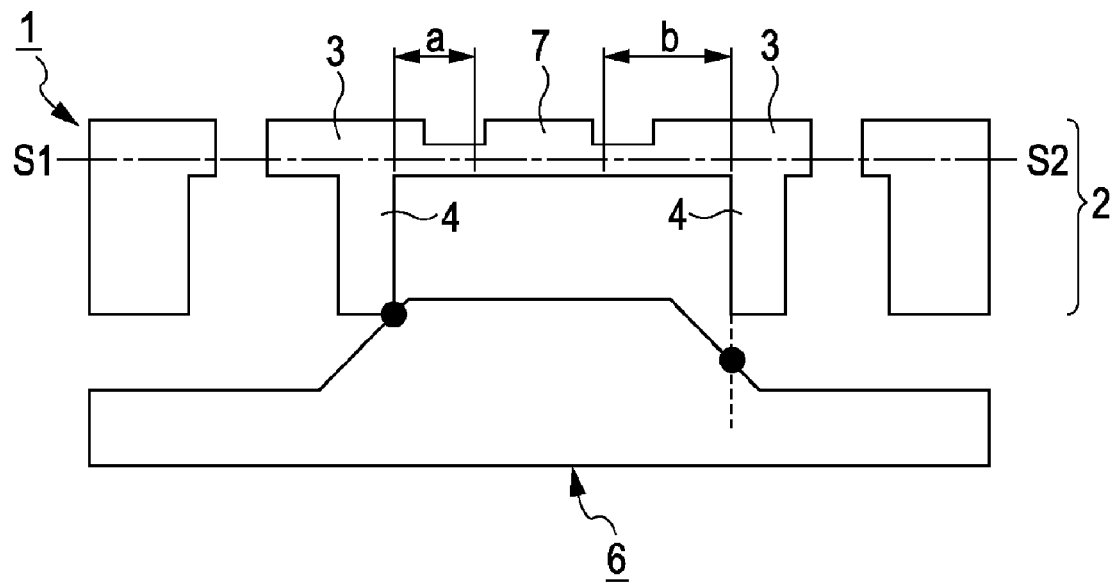
FIGS. 3A and 3B are schematic process drawings of a third example of the structure fabricating method according to the present invention.
Figure 3B:
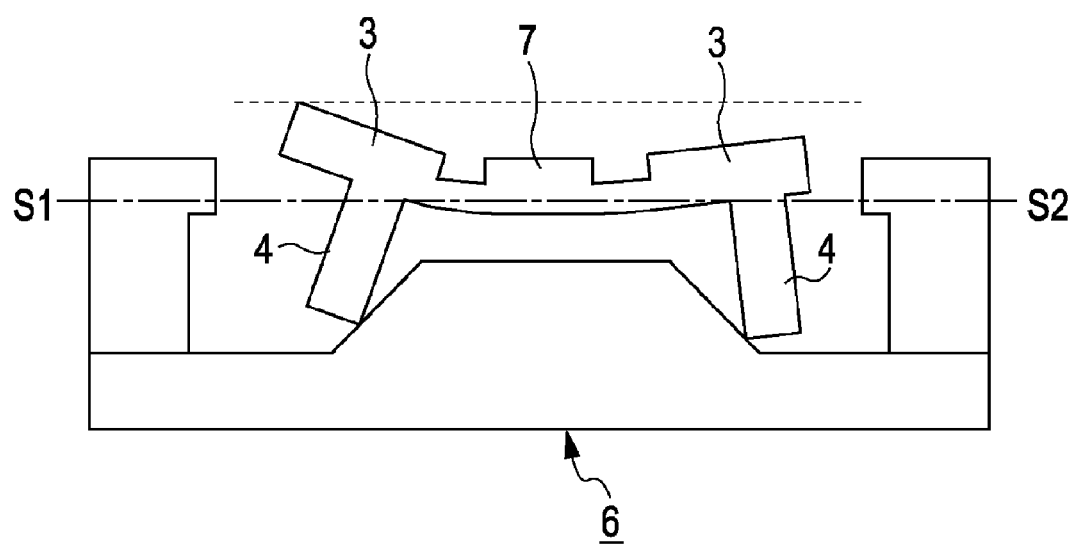

The method for changing the position where the projection 4 is in contact with the block 6 may include a method in that the distance from the base point of the plastic deformation is changed so as to provide the projection 4 of the work piece as shown in FIGS. 3A and 3B.

Although the distance from the base point of the plastic deformation is the same, in the projection 4 of the work piece, the position where the projection 4 is in contact with the block 6 can be changed.

Figure 4A:
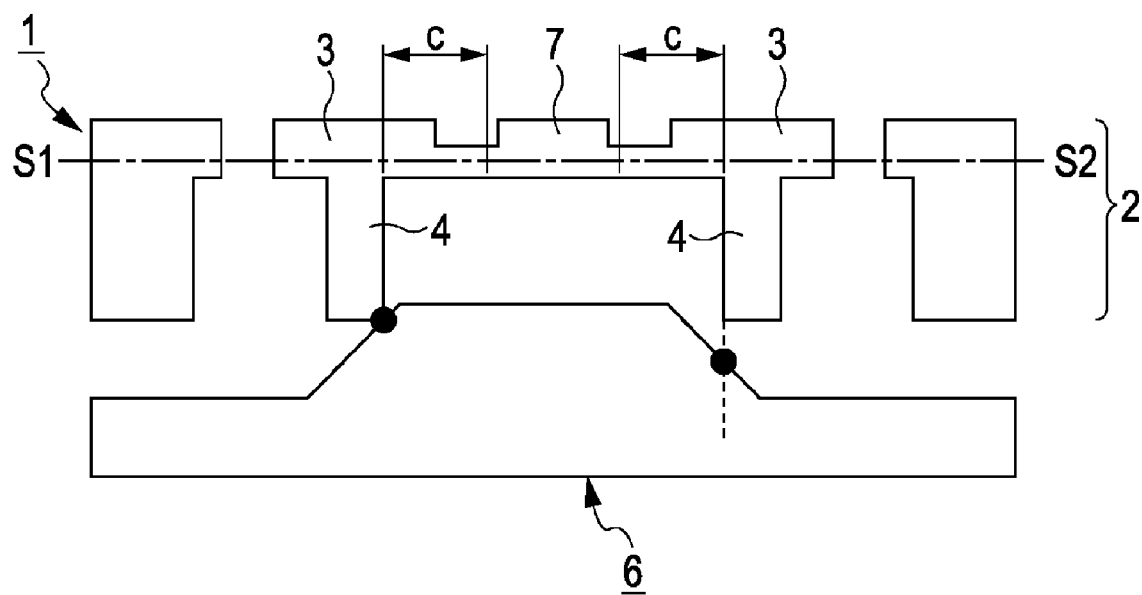
FIGS. 4A and 4B are schematic process drawings of a fourth example of the structure fabricating method according to the present invention.
Figure 4B:
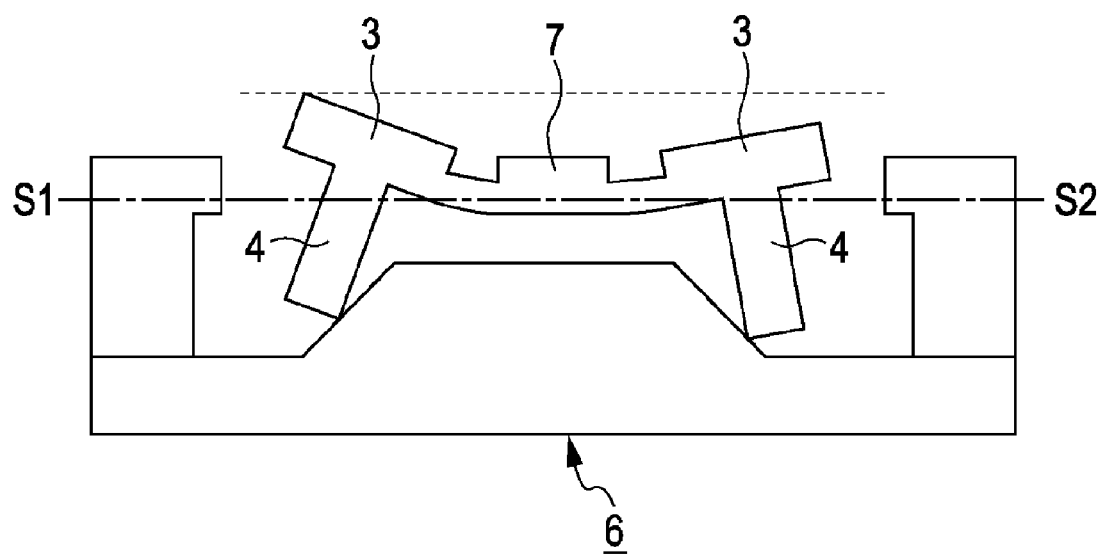

For example, as shown in FIGS. 4A and 4B, by displacing the inclined plane of the block 6 laterally in FIGS. 4A and 4B, the position where the projection 4 of the work piece is in contact with the block 6 can be changed.

Figure 5A:
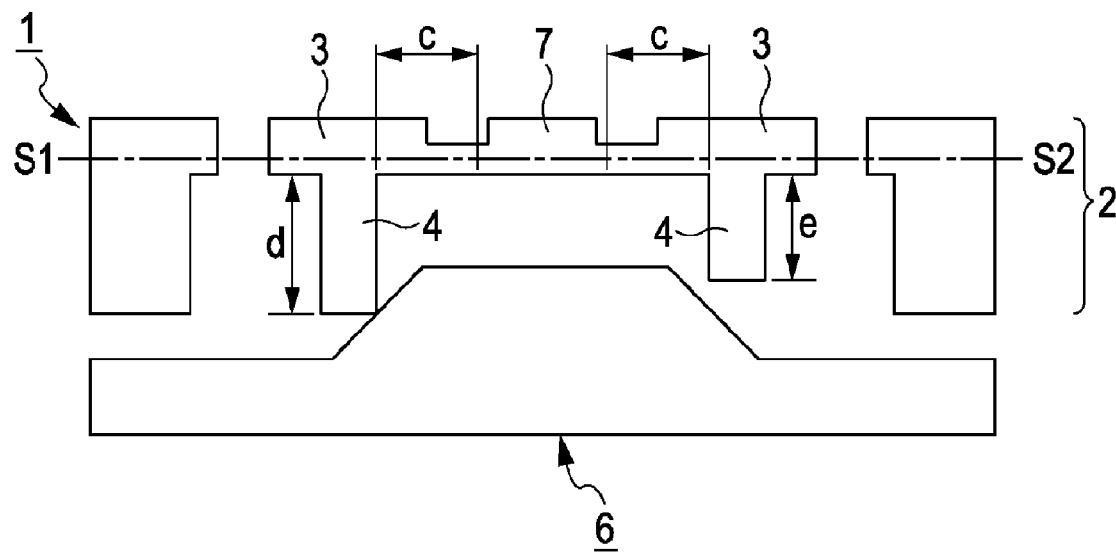
FIGS. 5A and 5B are schematic process drawings of a fifth example of the structure fabricating method according to the present invention.
Figure 5B:
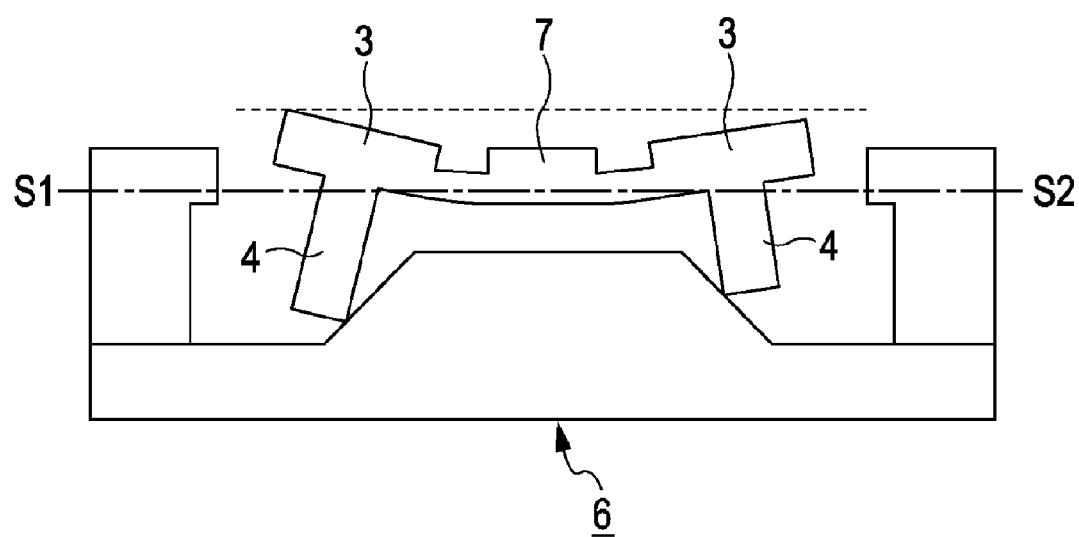

Furthermore, another method for changing the inclined angle of the work piece 3, i.e., the inclination part may include a method in that as shown in FIGS. 5A and 5B, the respective lengths of a pair of the projections 4 of the work piece differ from each other.

In the above examples, the fabrication examples of the work piece 3 extended from a movable part 7 of the structure have been shown.

Figure 6A:
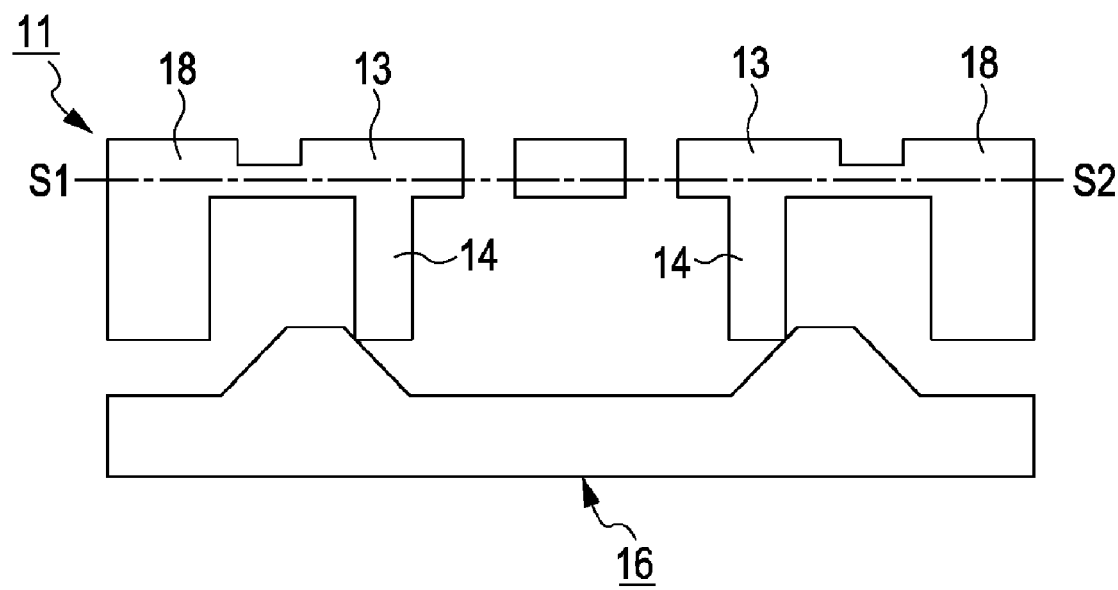
FIGS. 6A and 6B are schematic process drawings of a sixth example of the structure fabricating method according to the present invention.
Figure 6B:
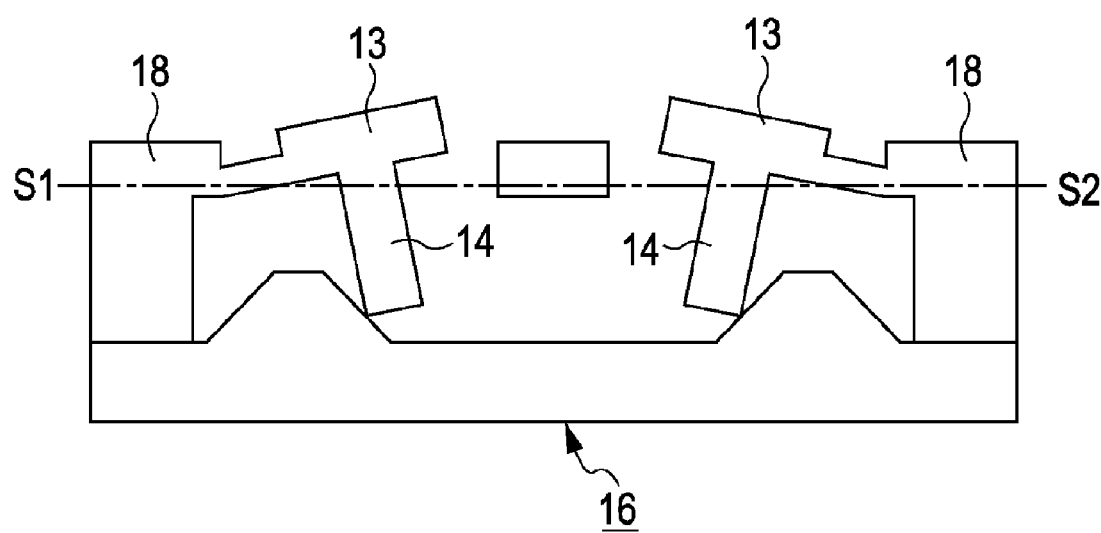
Figure 7A:
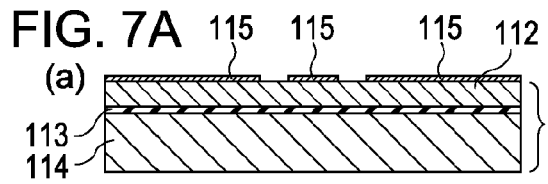
FIGS. 7A to 7L are process drawings of a structure fabricating method according to a first embodiment of the present invention.
Figure 7B:
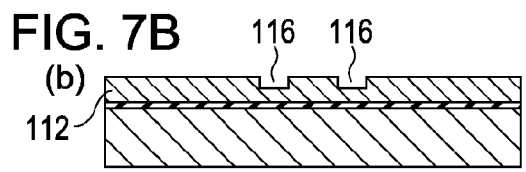
Figure 7C:
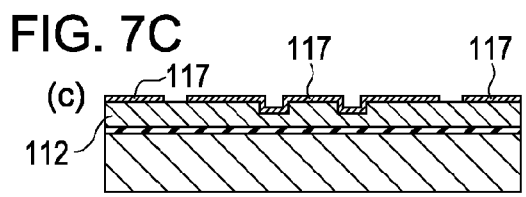
Figure 7D:
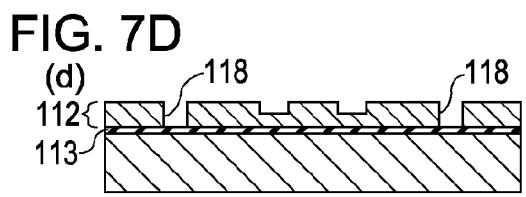
Figure 7E:
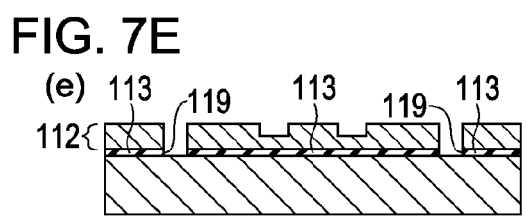
Figure 7F:
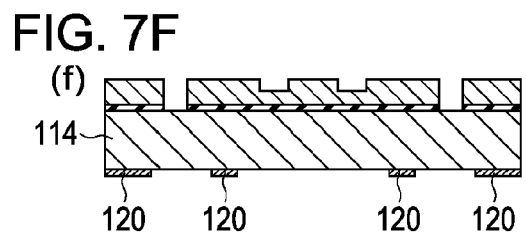
Figure 7G:
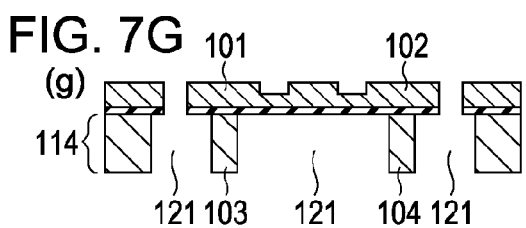
Figure 7H:
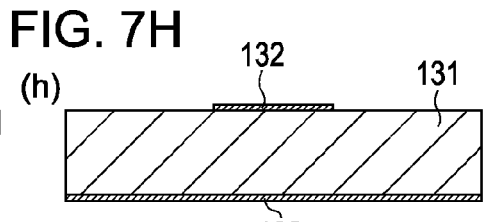
Figure 7I:
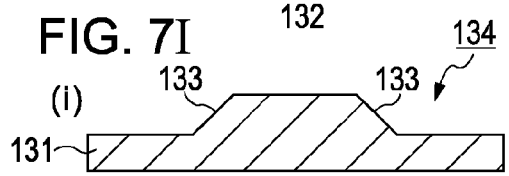
Figure 7J:
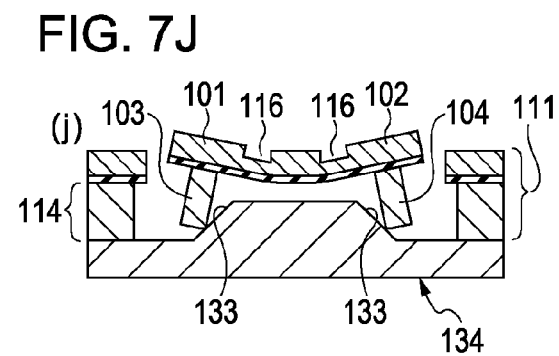
Figure 7K:
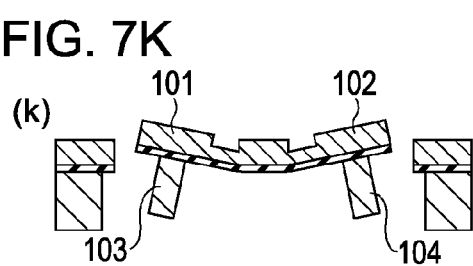
Figure 7L:
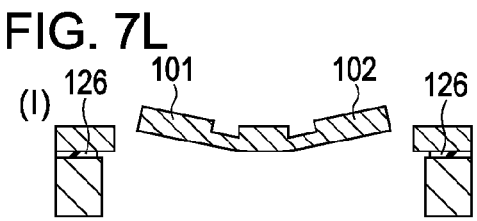

As shown in FIGS. 6A and 6B, a work piece 13 extended from a support 18 of a structure 11 can be fabricated by providing projections 14 and the block 16 in the same way as in the above examples.

According to the embodiment, the shape of the projection is rectangular; however, the present invention is not limited to this shape, so that a chamfered polygon or a curved surface shape may be adopted. In such a manner, by amending the shape of the projection, the catch during plastically deforming work can be suppressed.

EMBODIMENTS

With the following embodiments, the present invention will be described further in detail; however, the invention is never limited to these.

First Embodiment

In this embodiment, a fabrication method of a structure including an inclined part inclined in one direction to the principal plane (including a planar plane parallel to the principal plane) of the substrate in an out-of-plane state will be described.

FIGS. 7A to 7L show processes of a structure fabricating method according to the embodiment. Reference characters (a) to (i) in FIGS. 7A to 7L correspond to the processes (a) to (i), respectively.

First, according to the processes (a) to (g), work pieces 101 and 102 and projections 103 and 104 of the work pieces are formed.

(a): Mask layers 115 are formed on the surface of a semiconductor layer 112 of a substrate 111.

The substrate 111 has a laminated structure having an insulating layer 113 sandwiched between two layers, and these layers are called in this specification as the semiconductor layer, the insulating layer, and a supporting layer from the top in that order. The substrate 111 may use a SOI (silicon on insulator) substrate having a multilayered structure having the insulating layer 113 made from silicon dioxide sandwiched between two layers (the semiconductor layer 112 and the supporting layer 114) made from monocrystal silicon.

(b): Depressions 116 are formed on the semiconductor layer 112.

At this time, the depth of the depression 116 is to be smaller than the thickness of the semiconductor layer 112. The forming method of the depression 116 may preferably include an etching technique such as reactive ion etching.

The depth of the depression 116 can be controlled with the period of etching time.

(c): Mask layers 117 are formed on the semiconductor layer 112.

(d): Through holes 118 are formed in the semiconductor layer 112.

The forming method of the through hole 118 may preferably include the etching technique, such as the reactive ion etching, in the same way as in the forming method of the depression 116.

When employing the reactive ion etching, using an etching gas showing little reaction to the insulating layer 113 of the substrate 111, the through hole 118 can be securely formed with a predetermined depth.

(e): Through holes 119 are formed in the insulating layer 113 using the semiconductor layer 112 as a mask.

When using the SOI substrate as the substrate 111, for example, if an etchant or an etching gas capable of selectively etching silicon dioxide, such as hydrofluoric acid and carbon tetrafluoride, is used, only the insulating layer 113 can be etched.

(f): Mask layers 120 are formed on the bottom surface of the supporting layer 114.

(g): Through holes 121 are formed in the supporting layer 114.

Then, according to the processes (h) and (i), using a different substrate 131, a block 134 for inclining the work pieces 101 and 102 is fabricated.

It is preferable that the material of the substrate 131 for the block 134 be a material having a rigidity similar to or more than that of the substrate 111 and a thermal expansion coefficient similar to that of the semiconductor layer 112 of the substrate 111, in view of the heating the block 134 by pushing it to the substrate 111 thereafter.

When the substrate 111 is the SOI substrate, for example, the substrate 131 may preferably be selected from substrates made from monocrystal silicon (monocrystal semiconductor material) in the same way as in the semiconductor layer 112.

(h): A mask layer 132 is formed on the substrate 131.

(i): Inclined planes 133 are formed on the upper surface of the substrate 131.

A forming method of the inclined plane 133 may include an anisotropic etching technique with the etching rate depending on the crystal orientation, so that the inclined plane 133 can be formed on the upper surface of the substrate 131 by this method. When the substrate 131 uses a monocrystal silicon wafer with the principal plane perpendicular (100) to the crystal orientation <111>, by the anisotropic etching using potassium hydrate aqueous solution, the inclined plane starting from the vicinity of the end of the mask layer 132 is formed. At this time, the inclined plane is formed such that it inclines to the principal plane of the substrate at about 55°.

Finally, according to the following processes (j) to (l), the work pieces 101 and 102 are elevated in angle and then, the projections 103 and 104 of the work pieces are removed.

(j): By heating the depressions 116 of the semiconductor layer 112 and by pressing the inclined planes 133 of the block 134 onto the projections 103 and 104, the depressions 116 are folded to plastically deform them.

In the heating of the depressions, when using the SOI substrate as the substrate 111, for example, it is preferable to set the heating temperature at 600° C. or more required for plastically deforming silicon. A heating method may include a method for locally heating the vicinity of the depressions 116 with Joule heat generated by passing an electric current to a current path in the vicinity of the depressions 116. The current path may include a path made of a conductive thin film with a sufficiently high melting point and having an appropriate insulating film deposited thereon and a path of the semiconductor layer 112 itself if it is conductive.

The depressions 116 of the semiconductor layer 112 may also be heated by heating the whole substrate 111 and block 134 using an appropriate heating furnace while maintaining the pressing state of the block 134 to the substrate 111. A method for maintaining the pressing state of the block 134 to the substrate 111 may include clamping the block 134 and the substrate 111 from the outside using a clamp or a pinch and then bonding the block 134 to the substrate 111 with an adhesive or other bonding units.

In particular, when the substrate 111 uses the SOI substrate, by forming a layer of silicon dioxide on the upper surface of the block 134, the bottom surface of the substrate 111 can be bonded on the upper surface of the block 134 by the anode coupling.

(k): After cooling the substrate 111 to room temperature, for example, the block 134 is removed.

(l): Of the insulating layer 113, parts other than an insulating layer 126 are removed.

Since the projections 103 and 104 of the work pieces are fixed on the work pieces 101 and 102, respectively, via only the insulating layer 113, by the process (l), the projections 103 and 104 of the work pieces are removed together with the insulating layer 113. When using the SOI substrate as the substrate 111, for example, a method for removing the insulating layer 113 may include the isotropic etching of silicon dioxide using an etching liquid, such as hydrofluoric acid, and an etchant, such as the etching gas of carbon tetrafluoride. At this time, by adjusting the period of etching time, while the insulating layer 126 remains, the insulating layer 113 in the vicinity of the projections 103 and 104 and the work pieces can be removed.

Furthermore, in the process (j), when the substrate 111 and the block 134 are bonded together via a silicon dioxide layer by the anode coupling, the process (k) for removing the block and the process (l) for removing the insulating layer 113 can be simultaneously executed.

In the above examples, the fabrication method using the block 134 including the inclined planes 133 as pressure planes has been described; alternatively, a block including surface shapes other than the inclined plane may be adopted. For example, as shown in FIG. 2B, a block including a curved pressure plane may be used.

The fabrication method of a block including curved planes will be described below with reference to FIGS. 8A1 and 8B1.

Reference characters (a1) and (b1) in FIGS. 8A1 and 8B1 correspond to the processes (a1) and (b1), respectively.

(a1): A mask layer 142 is formed on a substrate 141.

(b1): Curved planes 143 are formed on the upper surface of the substrate 141.

A forming method of the curved plane 143 may include an isotropic etching technique that is cutting the upper surface of the substrate 141 in a curved shape. When the substrate 131 uses a monocrystal silicon substrate for example, by the isotropic etching using sulfur hexafluoride or xenon fluoride, the curved plane 143 starting from the vicinity of the end of the mask layer 142 can be formed. An etchant used in the isotropic etching of the monocrystal silicon substrate includes not only the gas described above but also a liquid such as mixture liquid of hydrofluoric acid and nitric acid.

An example of a structure fabricated by the fabricating method according to the embodiment is shown in FIG. 9.

FIG. 9 shows an oscillatory structure using an AVC including a plurality of movable combs 171 and 172 upwardly inclined to a reference plane horizontal to the substrate 111.

A voltage signal supply source 175 and 176 can generate a voltage with waveforms such as pulses and sin waves. By connecting them between the movable comb 171 and 172 and a fixed comb 173 and 174, a resonant panel 177 journaled on a torsion spring 178 can be vibrated.

Second Embodiment

By changing part of the processes of the first embodiment, a plurality of work pieces can be fabricated with different folding angles. In a second embodiment, three methods will be described. According to the embodiment, the folding work toward one direction relative to a plane parallel to the principal plane of the substrate will be described in the same way as in the first embodiment.

In a first method, the projections 103 and 104 of the work pieces are provided at positions different from each other in distance from the reference point for folding the work pieces 101 and 102.

Such projections 103 and 104 of the work pieces can be fabricated by changing the region for forming the mask layers 120 in the process (f) of the first embodiment as well as by changing the region for forming the through holes 121 in the process (g).

The situations when the block 134 is pressed onto the bottom surface of the supporting layer 114 and the projections 103 and 104 of the work pieces are the same as shown in FIG. 3B.

In a second method, a block 135 is used having a surface shape such that the heights, from the reference plane of the block, of positions, with which the projections 103 and 104 of the work pieces come in contact at first, respectively, are different from each other.

Such a block 135 can be fabricated by changing the region for forming the mask layer 132 in the process (h) of the first embodiment so as to change the region for forming the inclined planes 133.

In a third method, the projections 103 and 104 with different lengths of the work pieces are formed.

A method for forming the projections 103 and 104 with different lengths will be shown below with reference to FIGS. 10A2 to 10D2.

Figure 2A:
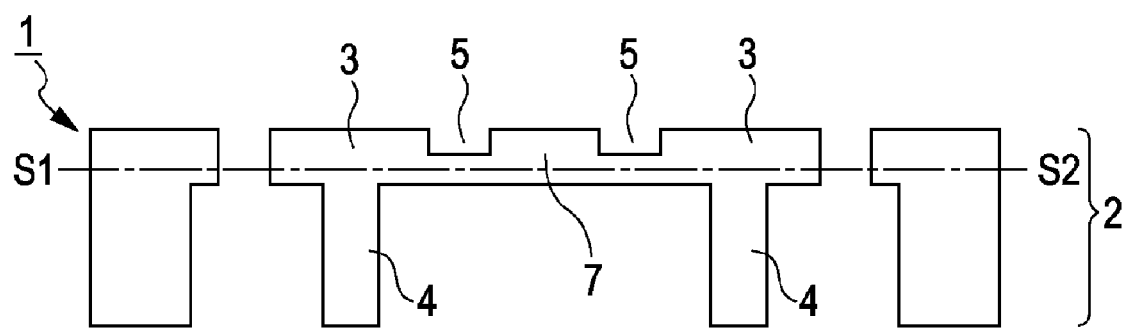
FIGS. 2A and 2B are schematic process drawings of a second example of the structure fabricating method according to the present invention.
Figure 2B:
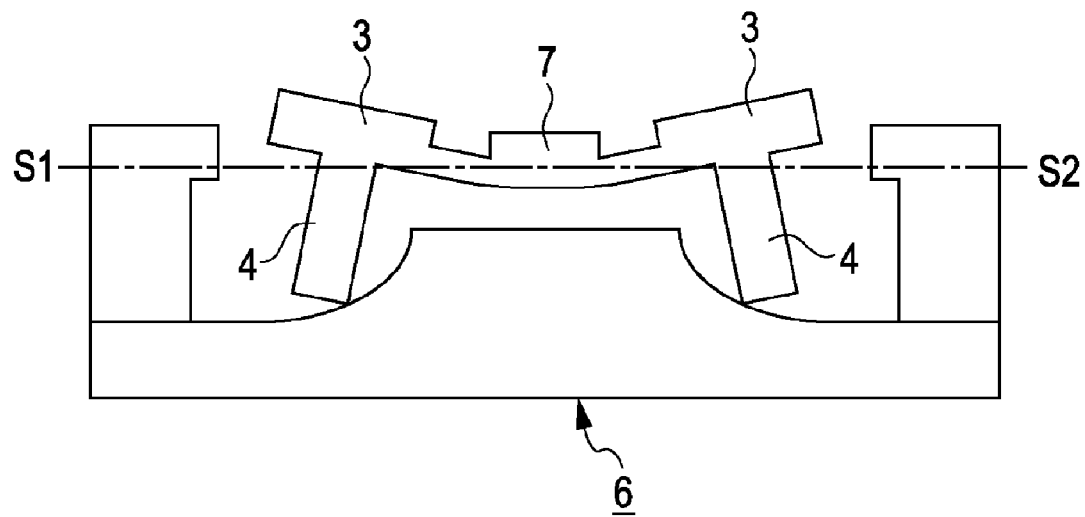

First, as shown in FIGS. 10A2 and 10B2, at the positions where the lengths and the positions of the projections 103 and 104 of the work pieces are aligned for forming them, mask layers 151 are formed, and a depression 152 is formed in the supporting layer 114.

The depth of the depression 152 is adjusted to the value obtained by subtracting the length of the projection 103 or 104 of the work piece to be formed from the thickness of the supporting layer 114.

As shown in FIG. 10B2, the depression 152 is formed such that the length of the projection 103 of the work piece equals the thickness of the supporting layer 114, while the length of the projection 104 of the work piece is shorter than the thickness of the supporting layer 114.

The depression 152 can be formed in the same way as in the process (b) of the first embodiment for forming the depression of the semiconductor layer.

Then, the work pieces 101 and 102 before inclination are formed by fabricating the semiconductor layer 112 and the insulating layer 113.

The fabrication of the semiconductor layer 112 and the insulating layer 113 can be executed in the same way as in the processes (a) to (e) of the first embodiment.

Then, as shown in FIGS. 10C2 and 10D2, mask layers 153 are formed on the bottom surface of the supporting layer 114 for forming the through holes 121.

The through holes 121 can be formed in the same way as in the process (g) of the first embodiment.

The subsequent processes for fabricating the block 134, for elevating the work pieces 101 and 102 in angle, and for removing the projections 103 and 104 of the work pieces can be performed in the same way as in the processes (h) to (l), respectively.

The situations when the block 134 is pressed onto the bottom surface of the supporting layer 114 and the projections 103 and 104 of the work pieces are the same as shown in FIG. 3B.

Instead of the processes shown in FIGS. 10A2 to 10D2, the projections 103 and 104 with different lengths of the work pieces can also be formed according the processes shown in FIGS. 11A3 to 11D3.

First, as shown in FIGS. 11A3 and 11B3, mask layers 161 are formed on the substrate 111 and depressions 162 are formed on the supporting layer 114.

The depth of the depression 162 is adjusted to the value obtained by subtracting the length of the projection 103 or 104 of the work piece to be formed from the thickness of the supporting layer 114.

Then, the work pieces 101 and 102 before inclination are formed by fabricating the semiconductor layer 112 and the insulating layer 113.

Then, as shown in FIGS. 11C3 and 11D3, mask layers 163 are formed for forming the through holes 121 in the supporting layer 114.

Third Embodiment

In a third embodiment, the fabricating method of a structure including a work piece serving as an inclined part inclined at different angles to the principal plane of the substrate in an out-of-plane state in the up and down directions will be described.

Figure 12A:
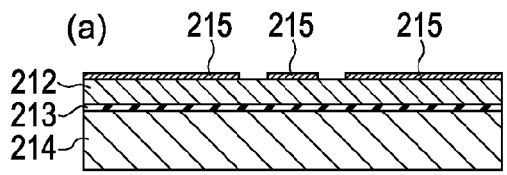
FIGS. 12A to 12O are process drawings of a structure fabricating method according to a third embodiment of the present invention.
Figure 12E:
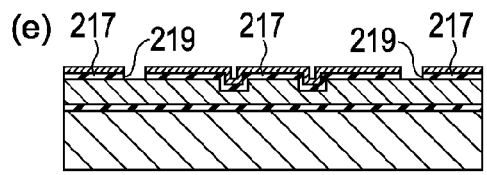
Figure 12B:
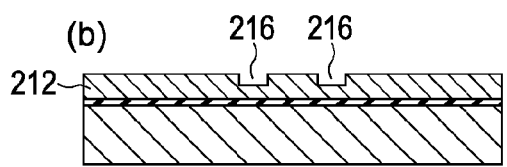
Figure 12F:
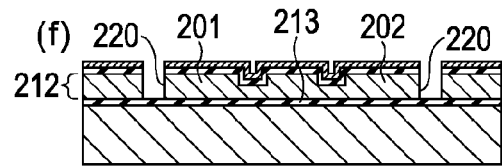
Figure 12C:
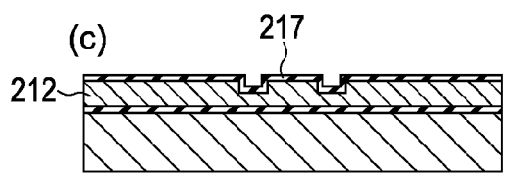
Figure 12G:
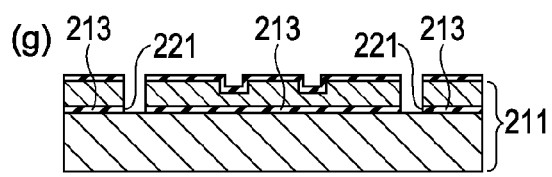
Figure 12D:
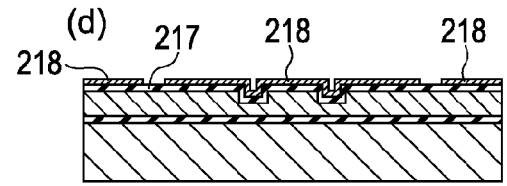
Figure 12H:
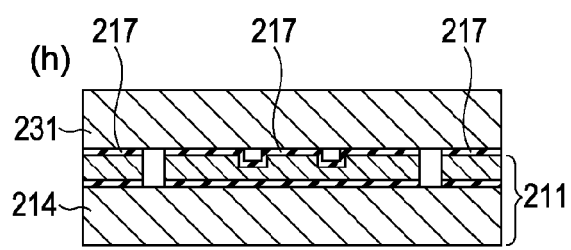
Figure 12I:
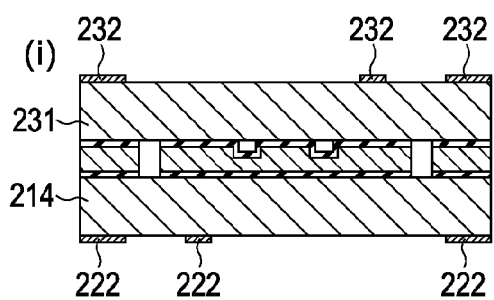
Figure 12M:
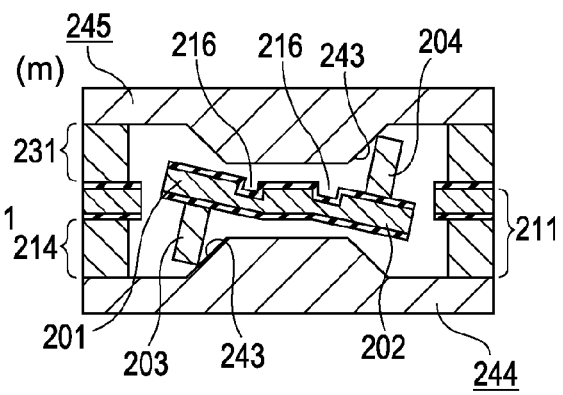
Figure 12J:
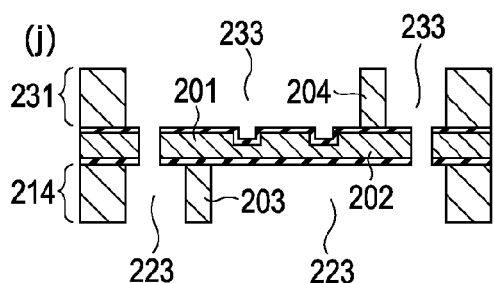
Figure 12N:
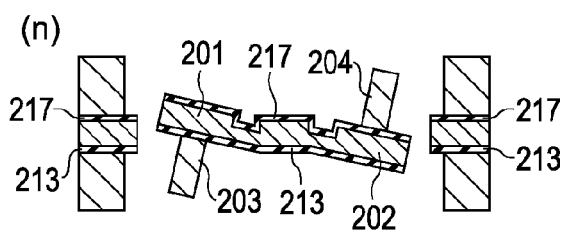
Figure 12K:
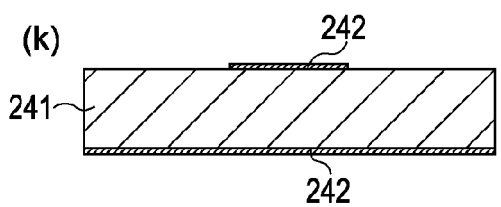
Figure 12O:
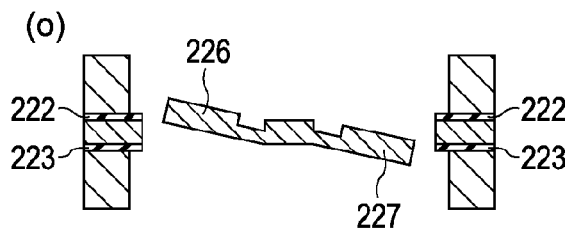
Figure 12L:

The process drawings of the structure fabrication method according to the embodiment are shown in FIGS. 12A to 12O. Reference characters (a) to (o) in FIGS. 12A to 12O correspond to the processes (a) to (o), respectively.

First, according to the following processes (a) to (j), work pieces 201 and 202 before inclination and projections 203 and 204 of the work pieces are formed.

(a): On the upper surface of a semiconductor layer 212 of a substrate 211, mask layers 215 are formed.

The substrate 211 is the same three-layered substrate (the semiconductor layer 212, the insulating layer 213, and the supporting layer 214) as the substrate 111 used in the first embodiment, and may use the SOI substrate, for example.

(b): Depressions 216 are formed on the semiconductor layer 212.

The depression 216 can be formed in the same way as in the process (b) of the first embodiment. The depth of the depression 216 is smaller than the thickness of the semiconductor layer 212.

(c): On the upper surface of the semiconductor layer 212, an insulating layer 217 is formed.

The insulating layer 217 can be formed by depositing an insulating material, such as silicon dioxide, thereon.

(d): On the upper surface of the insulating layer 217, mask layers 218 are formed.

(e): On the insulating layer 217, through holes 219 are formed.

The depression 219 can be formed in the same way as in the process (e) of the first embodiment.

(f): Using the insulating layer 217 as a mask, through holes 220 are formed in the semiconductor layer 212.

The through hole 220 can be formed in the same way as in the process (d) of the first embodiment.

(g): In the insulating layer 213 of the substrate 211, through holes 221 are formed.

(h): A substrate 231 is bonded on the upper surface of the insulating layer 217.

The substrate 231 may preferably use the same substrate as the supporting layer 214 of the three-layered substrate 211. For example, when the substrate 211 uses the SOI substrate, it is preferable to use a substrate made of monocrystal silicon as the substrate 231. When the substrate 231 uses the monocrystal silicon substrate, it can be bonded by the anode coupling.

(i): On the upper surface of the substrate 231, mask layers 232 are formed, and on the bottom surface of the supporting layer 214 of the substrate 211, mask layers 222 are formed.

(j): In the substrate 231, through holes 233 are formed, and in the supporting layer 214, through holes 223 are formed.

Then, according to the following processes (k) and (l), blocks 244 and 245 respectively inclining the work pieces 201 and 202 are fabricated (i.e., two blocks are fabricated).

(k): On a substrate 241, a mask layer 242 is formed.

(l): On the upper surface of the substrate 241, inclined planes 243 are formed.

The inclined plane 243 can be formed in the same way as in the process (l) of the first embodiment.

Finally, according to the following processes (m) to (o), the work pieces 201 and 202 are angled and then, the projections 203 and 204 of the work pieces are removed.

(m): The depression 216 of the semiconductor layer 212 on the substrate 211 is heated while the block 244 is pressed onto the bottom surface of the supporting layer 214 on the substrate 211 and the projection 203 of the work piece. Simultaneously, the block 245 is held upside down and pressed onto the upper surface of the substrate 231 and the projection 204 of the work piece. Thereby, the depression 216 is plastically deformed.

Since the heating temperature and method are substantially the same as in the process (j) of the first embodiment, the description is omitted. According to the embodiment, using two blocks, from both sides of the supporting layer 214 and the substrate 231, the depression is simultaneously deformed; alternatively, using one block, the depression may be deformed from one-side by the other.

(n): After the substrate 211 is cooled to the room temperature, for example, the blocks 244 and 245 are removed.

(o): Of the insulating layers 213 and 217, parts other than insulating layers 224 and 234 are removed. Since the projections 203 and 204 of the work pieces are fixed to the work pieces 201 and 202 via only the insulating layers 213 and 217, respectively, by this process, the projections 203 and 204 of the work pieces are removed together with the insulating layers 213 and 217.

The removing method of the insulating layers 213 and 217 is substantially the same as in the process (l) of the first embodiment, so that the description is omitted.

An example of a structure fabricated by the fabricating method described above is shown in FIG. 13 (for the easy visibility, the substrate 231 and the insulating layer 217 are shown in section on a vertical plane passing through chain line F1-F2).

Figure 13:
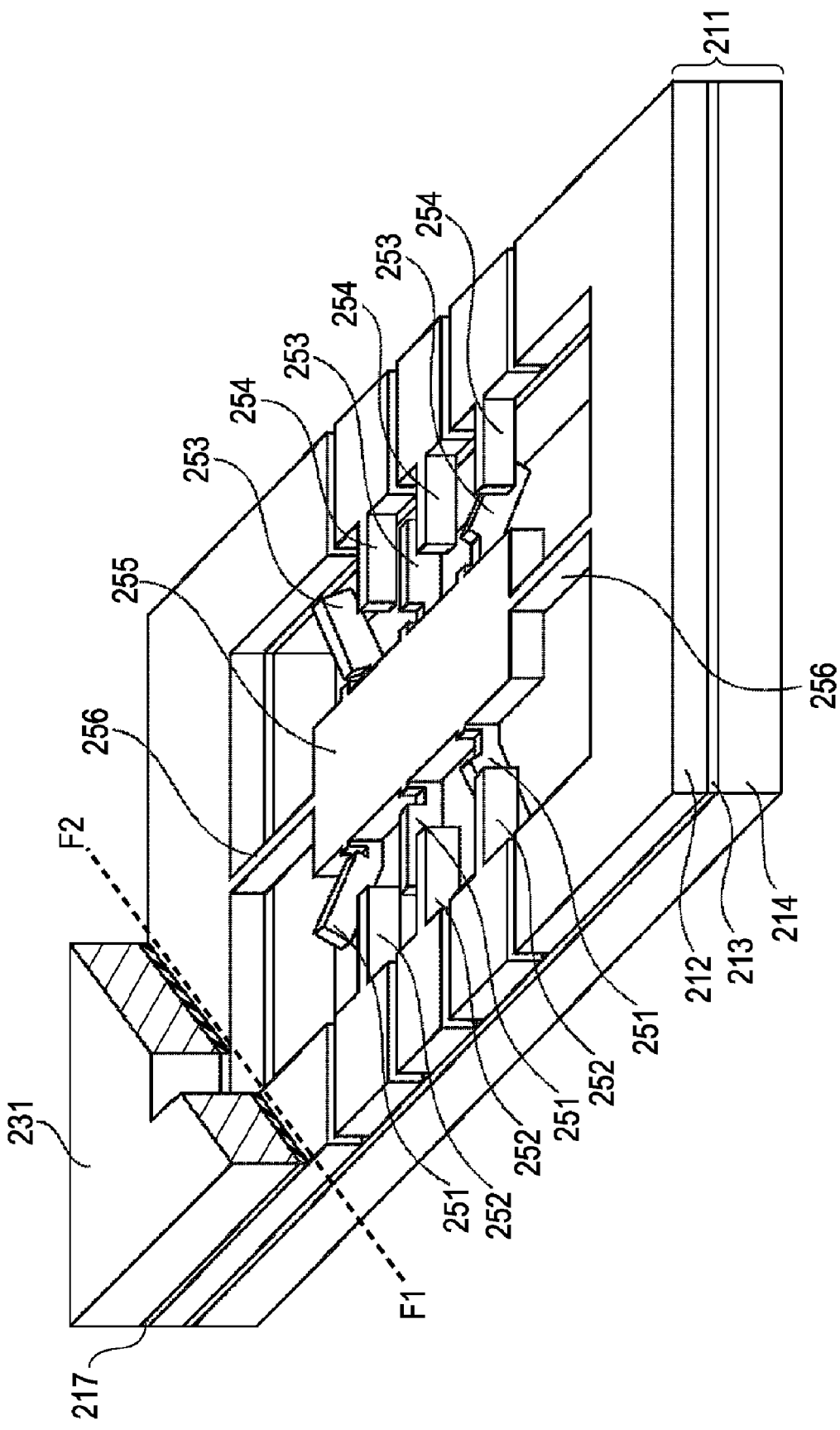
FIG. 13 is a drawing showing an example of a structure fabricated by the structure fabricating method according to the third embodiment of the present invention.

FIG. 13 shows the AVC including a plurality of combs 251 and 253 inclined to a plane horizontal to the principal plane of the substrate 211 in both the up and down directions. When a resonant panel 255 journaled on a torsion spring 256 is vibrated, the area of each movable combs 251 and 253 facing fixed combs 252 and 254 is changed.

By the fabrication method according to the present invention, such a complicated structure can be fabricated.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese application No. 2007-203245 filed Aug. 3, 2007, which is hereby incorporated by reference herein in its entirety.

What is claimed is:

1. A micro-structure fabrication method for fabricating a micro-structure by plastically deforming a work piece having a substrate with a principal plane, the micro-structure including an inclined part inclined to the principal plane of the substrate, the micro-structure fabrication method comprising the steps of:
providing, prior to fabricating the micro-structure, a work piece having a projection configured to protrude from a first surface and away from the principal plane of the substrate; and
fabricating the micro-structure by bending the work piece toward a second surface opposite to the first surface by applying a force on a block including an inclined pressure plane that abuts the projection for plastically deforming the work piece,
wherein in bending the work piece, the direction of a first force applied by the block intersects with the direction of a second force of the inclined pressure plane pushing the projection, and the inclined part is formed on the work piece.

2. The method according to claim 1, wherein the inclined pressure plane, which abuts the projection, is composed of a first plane inclined at an angle in a direction opposite to that plastically deforming the work piece relative to a second plane parallel to the principal plane of the substrate.

3. The method according to claim 1, wherein the inclined pressure plane, which abuts the projection, includes a curved plane inclined at an angle in a direction opposite to that plastically deforming the work piece relative to a second plane parallel to the principal plane of the substrate.

4. The method according to claim 1, wherein the micro-structure includes a plurality of work pieces, each having a projection, and the projections are provided on one side of the plane parallel to the principal plane of the substrate.

5. The method according to claim 4, wherein lengths of the projections provided in the plurality of work pieces are different from each other.

6. The method according to claim 5, wherein the block has a surface configuration such that lengths of perpendiculars extending from contact positions of the projections different in length from each other and the block to the reference plane parallel to the principal plane of the substrate correspond to the angles plastically deforming the work pieces, respectively.

7. The method according to claim 5, wherein the projections different in length from each other and protruding from the work pieces are arranged at positions where the distances from a base point of the plastically deforming the work pieces correspond to the angles plastically deforming the work pieces, respectively.

8. The method according to claim 4, wherein the projections protruding from the plurality of work pieces have lengths corresponding to the angles of the plastically deforming work pieces, respectively.

9. The method according to claim 1, wherein the micro-structure includes a plurality of work pieces, each having a projection, and at least one of the projections is provided on a side opposite to another projection relative to a plane parallel to the principal plane of the substrate.

10. The method according to claim 1, further comprising the step of providing a depression in the work piece.

11. The method according to claim 1, further comprising the step of heating at least part of the work piece.

12. The method according to claim 1, wherein the substrate has a multilayered structure including at least two semiconductor layers and at least one insulating layer sandwiched between the semiconductor layers and made of an insulating material.

13. The method according to claim 1, wherein the block is made of a monocrystal semiconductor material.

* * * * *